United States Patent [19]

Henry et al.

[11] Patent Number: 4,660,008

[45] Date of Patent: Apr. 21, 1987

[54] PIN DIODE SWITCH MOUNTED IN A RIDGE WAVEGUIDE

[75] Inventors: Raymond Henry, Fontenay aux Roses; Michel Heitzmann, Combs la Ville; Gilles Sillard, Plaisir, all of France

[73] Assignee: Thomson-CSF, Paris, France

[21] Appl. No.: 654,872

[22] Filed: Sep. 27, 1984

[30] Foreign Application Priority Data

Sep. 30, 1983 [FR] France ................ 83 15650

[51] Int. Cl.$^4$ ............................................. H01P 1/15
[52] U.S. Cl. ................................ 333/258; 333/262; 357/58
[58] Field of Search ............ 333/258, 262, 256, 103; 357/58, 55; 307/256, 259, 317 R

[56] References Cited

U.S. PATENT DOCUMENTS

| | | | |
|---|---|---|---|
| 3,346,825 | 10/1967 | Scott et al. | 357/58 X |
| 3,761,711 | 9/1973 | Hall | 357/58 X |
| 3,852,794 | 12/1974 | Pearson et al. | 333/262 X |
| 3,982,267 | 9/1976 | Henry | 357/58 X |
| 4,163,240 | 7/1979 | Swinehart et al. | 357/58 X |
| 4,301,429 | 11/1981 | Goldman et al. | 333/22 R |
| 4,507,632 | 3/1985 | Baril et al. | 333/258 |

FOREIGN PATENT DOCUMENTS 0073165  3/1983  European Pat. Off. .

OTHER PUBLICATIONS

Muller, J.; "Pin–Diode for the Modulation of mm–Wave Frequencies"; *IEEE Transactions on Electron Devices;* vol. ED-23, No. 1; Jan. 1976, pp. 61–63.

Nyss, N. L.; Millimetre Pin Diode Control Devices; paper from *Microwaves Associates Ltd.,* Dunstable, U.K.

RCA Review, vol. 38, No. 3, Sep. 1977, Princeton (US) Y. S. Chiang et al., pp. 390–405.

*Primary Examiner*—Eugene R. LaRoche
*Assistant Examiner*—Benny Lee
*Attorney, Agent, or Firm*—Oblon, Fisher, Spivak, McClelland & Maier

[57] ABSTRACT

A millimetric electromagnetic waves switch is constituted by a ridged waveguide associated to a PIN diode of which the layers P+ and N+ are very thin, of about 2 to 5 microns thickness. The width of the diode is inferior to that of the ridged part of the guide and its dimension according to the longitudinal axis of the guide is a multiple of the half-length of the guided wave.

8 Claims, 3 Drawing Figures

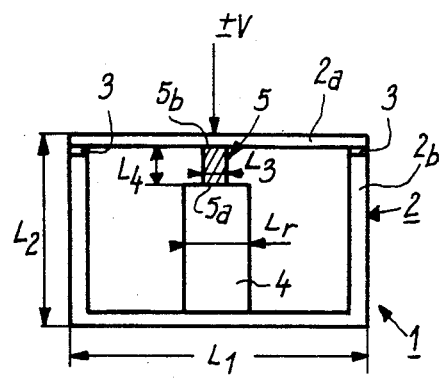
FIG_1
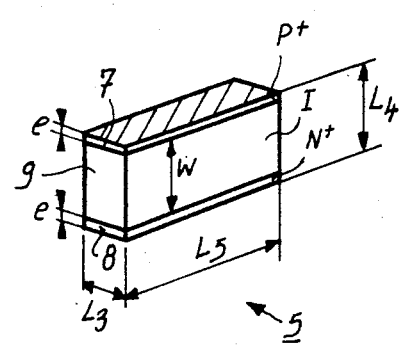
FIG_2
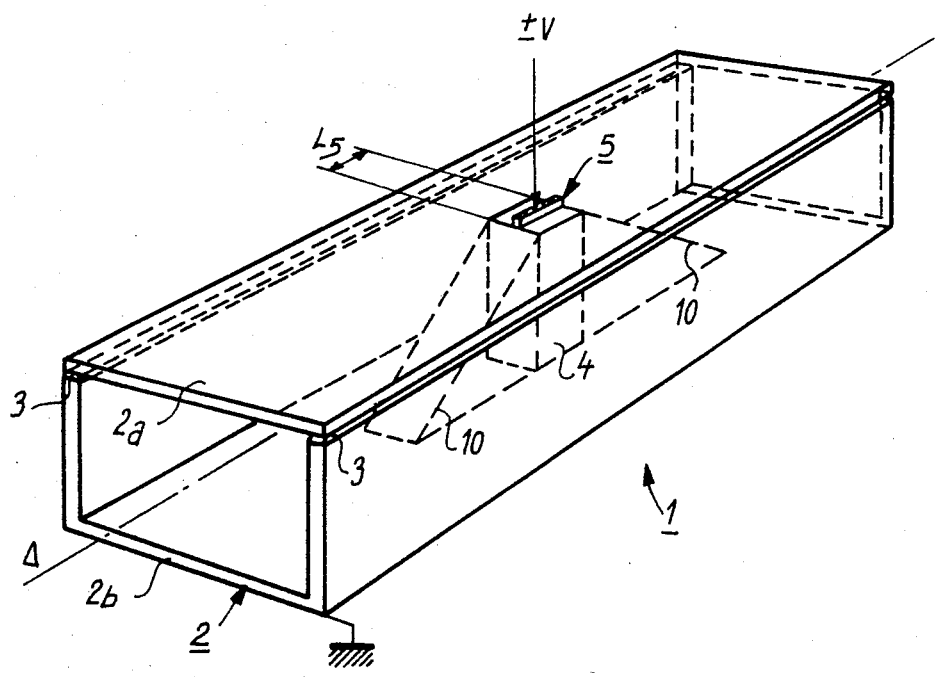
FIG_3

PIN DIODE SWITCH MOUNTED IN A RIDGE WAVEGUIDE

BACKGROUND OF THE INVENTION

The present invention concerns an electromagnetic wave switch realized from a PIN diode mounted in a waveguide and operating for millimetric waves, especially at 94 GHz. The purpose of such a device is to transmit with a minimal loss of power the hyperfrequency signals and to attenuate to a maximum these same signals by using two polarization states.

A millimetric electromagnetic wave switch structure with PIN diode is already known, such as described in U.S. patent application Ser. No. 410,708 now U.S. Pat. No. 4,507,632 entitled "Electromagnetic wave switch". According to this patent application, the switch is constituted by a metallic ridged rectangular waveguide, for example made of copper, and of which the dimensions allow the propagation of millimetric waves, with a PIN diode made of silicon of the classic type associated to a polarization circuit and mounted in the ridged space, of a determined volume, foreseen by the guide.

Further according to this patent application, the volume of the PIN diode is identical to that of the ridged space and in a particular embodiment mentioned in the application, the dimensions of the straight section of the guide are equal to 2.54 mm by 1.27 mm, while those of the classic PIN diode are equal to b 0.6 mm in length by 0.4 mm in thickness and 0.7 mm along the longitudinal axis of the guide. This latter dimension of the PIN diode corresponds to $3\lambda_g/4$, i.e. a multiple of one quarter the guided wavelength $\lambda_g$ at the operating frequency of 94 GHz.

Furthermore, it is known that a classic PIN diode presents thick zones or areas P+ and N+, of about from 30 to 80 microns, this with the aim of obtaining very high breakdown voltages.

On the basis of the dimensions given above for the classic PIN diode, with respective layers P+ and N+ of 40 microns thickness, the applicant has carried out tests of this type of millimetric electromagnetic wave switches according to the prior art, at an operating frequency of 94 GHz and for a strong pulsed incident power of 1 kW.

In fact, the performances noted for this switch are poor, and in particular the insertion losses measured at low level and at zero polarization are unacceptably high, being of about 4 dB, including 3.4 dB which are due to the assembly of the PIN diode. On the other hand, the isolation, measured in direct polarization with a current value of about 20 mA, the value is of about 20 dB, which is relatively mediocre. Consequently, this classic PIN switching diode does not give satisfactory enough performances in the range of millimetric waves.

SUMMARY OF THE INVENTION

The purpose of the present invention is to realize a PIN diode for the switching at strong incident power of millimetric electromagnetic waves, especially at 94 GHz, and mounted in a ridged waveguide, that allows through an appropriate choice of its dimensions to improve, even optimize, the overall performances of the switch according to the prior art, and in particular the insertion losses, while having an excellent power stability.

With this in mind, the object of the invention is an electromagnetic wave switch comprising:

a ridged metallic rectangular waveguide, with dimensions allowing the propagation of millimetric waves;

a PIN diode mounted in the ridged space foreseen by the guide, the zones P+ and N+ of the diode each having a thickness such that it is less than the respective skin effect thickness for these zones P+ and N+ at the operating frequency involved.

According to another feature of the invention, the dimension of the PIN diode aligned with respect to the longitudinal axis of the guide is a multiple of a half wavelength controlled at the central frequency of the operating band.

According to a further aspect of the invention, the width of the PIN diode is comprised between 0.15 mm and 0.40 mm at the operating frequency involved.

Therefore, the combination of these three characteristics of the invention leads to the attainment of an optimal PIN diode for the commutation of electromagnetic waves of the millimetric field.

BRIEF DESCRIPTION OF THE DRAWINGS

Other characteristics and advantages of the invention will appear more clearly from reading the following detailed description with reference to the annexed drawings, given simply by way of non-limitative example and in which:

FIG. 1 represents a sectional view of the switch according to the invention along a section of the guide;

FIG. 2 represents a view in perspective of the PIN diode utilized for the switch; and FIG. 3 represents a view in perspective of the switch shown in FIG. 1.

On these figures, the same references designate the same references.

DETAILED DESCRIPTION OF THE PREFERRED EMBODIMENT

FIG. 1 represents an electromagnetic wave switch 1 according to the invention, in sectional view along a section, and intended to operate in the frequency band of about 93 GHz to 95 GHz. It is realized from a rectangular waveguide 2, realized in two portions of which one is a plane metallic plate 2a, for example made of copper, and of which the other is a U-shaped metallic plate 2b for example also made of copper, the assembly of the two plates forming the recess of the waveguide. The two plates are insulated from each other by a layer of insulating material 3.

In order to realize a cut or ridged waveguide, the plate 2b comprises in its central part a metallic step or notch 4, for example made of copper, providing in the guide 2 a ridged space in which is concentrated the electric field. In this ridged space is disposed a parallelepipedic shaped semiconductor bar 5 having a rectangular straight section.

Given the dimensions of the waveguide operating in millimetric waves, for example at an operating frequency of 94 GHz, it is possible to place a semiconductor chip such as a silicon PIN diode in the ridged space. In one particular embodiment, the dimensions of the straight section of the guide 2 are $L_1 = 2.54$ mm and $L_2 = 1.27$ mm and those of the ridged space are:

$L_r=0.6$ mm and $L_4=0.4$ mm

The cathode 5a of the PIN diode 5 is connected to the step or notch 4 while its anode 5b is connected to the plate 2a. The diode is polarized through application of a voltage ±V between these two parts. Furthermore, in order to ensure a good thermal dissipation, and two opposed metallic faces of the diode 5 are respectively welded, one to the plate 2a and the other to the step or notch 4.

The operating of this type of switch is the following.

When the PIN diode is blocked, the guide on the one hand can be considered as filled with a dielectric material of constant high dielectric $\epsilon$ and on the other hand has dimensions such that the propagation of a millimetric wave is possible. In this case, such a wave is transmitted through the switch.

On the contrary, when the PIN diode is conducting, it is equivalent to a resistance and the incident millimetric wave is absorbed by the diode as well as an impedence.

The structure of the silicon PIN diode 5 for the switching of millimetric waves will now be described, according to a preferred embodiment of the invention, by referring to FIG. 2 on which the dimensions of the diode have been exaggerated in order to secure enhanced clarity.

It will firstly be recalled that the electromagnetic waves switching PIN diode, in zero or reverse polarization and mounted in the ridged space of the waveguide, can be assimilated to a capacitance connected in series with an introductive resistance of losses at the involved operating frequency.

According to one aspect of the invention, the PIN diode 5 has two doped zones or areas 7 and 8, respectively P+ and N+ that each have a thickness e selected so that it is smaller than the respective skin thickness $\delta$ for these zones P+ and N+ at the operating frequency involved.

It is known that at high frequency the semiconductor material of the PIN diode mounted between two conductor planes, for example made of copper, is subject to the skin effect so that the current in the diode is localized in a skin thickness $\delta$ for each of the zones P+ and N+ defined by:

$$\delta(P^+;N^+) = \delta(copper) \cdot \sqrt{\frac{\rho(P^+;N^+)}{\rho(copper)}}$$

in which
$\rho(P^+; N^+)$ is the resistivity of the zone P+ or N+;
$\rho(copper)$ is the resistivity of the copper equal to $1.7 \cdot 10^{-6}$ $\Omega$cm, and
$\delta(copper)$ expressed in cm is the skin thickness for the copper equal to $6.6/\sqrt{f}$ where f is the operating frequency expressed in Hz.

or:

$$\delta(P^+;N^+) = \frac{6.6}{\sqrt{f}} \sqrt{\frac{\rho(P^+;N^+)}{1.7 \cdot 10^{-6}}}$$

expressed in cm for f in Hz and $\rho(P^+; N^+)$ in $\Omega$·cm.

Thus, for an operating frequency, for example, of 94 GHz, and for a PIN diode made of silicon of which the doped layer P+ is of resistivity of about from 0.01 $\Omega$cm and the N+ doped layer is of resistivity of about 0.0065 $\Omega$cm, and this at equal doping ($10^{19}$ atoms/cm$^3$), the layer P+ and N+ have respective skin thickness of about:

$\delta = 17$ microns for the P+ layer
$\delta = 13$ microns for the N+ layer

Thus, the fact of having chosen thicknesses of layers P+ and N+ inferior to their respective skin thicknesses allows the current in the diode to pass more rapidly in the conductor material of the guide, for example in copper, which has the effect of reducing the insertion losses of the diode at the involved operating frequency. Furthermore, by selecting the thickness values of the layers P+ and N+ which are very inferior to their respective skin thicknesses, the current in the diode passes for a large part in the copper, thus practically without being localized in the doped silicon zones, thus allowing to further reduction in insertion losses of the diode.

Through experimentation, a thickness value e of the layers P+ and N+ comprised between 2 and 5 microns appears as a good compromise for the attainment of very low losses, in particular at the operating frequency of 94 GHz for a resistivity of each zone P+ and N+ of about 0.007 $\Omega$·cm, the ridged waves guide being made of copper, thus giving a respective skin thickness for the zones P+ and N+ of about 15 microns.

Consequently, the PIN diode utilized in the framework of the invention presents very thin zones P+ and N+, of about 2 to 5 microns thickness, and is therefore not a classic PIN diode for which the layers P+ and N+ have a thickness of about 40 microns, at the operating frequency involved, in particular at 94 GHz.

The thickness $L_4$ of the PIN diode 5 is fixed by the height of the ridged space, i.e. in the example chosen, $L_4=0.4$ mm. This thickness value of the diode results from both the limitations imposed by the power stability and from the search for a commutation time that is not too long. Furthermore, the obtention of a step impedance of about 100 ohms allows to polarize directly the diode so that it absorbs the incident power with the classic current values (several mA to 30-50 mA) while presenting slight heat.

As will appear from FIG. 2, the PIN diode possesses a zone 9 of intrinsic material I disposed between the two doped zones P+ N+, and of thickness W of about 390 microns in the example selected, i.e. with $L_4=400$ microns and a thickness e of each layer P+ and N+ of about 5 microns.

With the aim of further improving the overall performances of the commutation PIN diode 5, its width $L_3$ is chosen so that it is comprised between 0.15 mm and 0.40 mm at the operating frequency involved. These two values correspond respectively to a quarter and two thirds of the width $L_r$ of the step equal to 0.6 mm in the example already indicated. Consequently, the width of the PIN diode is therefore smaller to that of the step and thus the volume of the diode is no longer identical to that defined by the ridged space.

These values of 0.15 mm and 0.40 mm for the width $L_3$ of the PIN diode constitute critical values in the sense that it has been shown, by experiment, that for values higher than 0.40 mm the insertion losses noted were too high, and that for values lower than 0.15 mm on the one hand, the diode does not absorb all the incident power so that its true insulation was too weak and, on the other hand, the thermal resistance of the diode increased thus leading to a prohibitive heating of this diode.

For an operating frequency of 94 GHz, a value of about 0.2 mm for the width $L_3$ of the PIN diode appears to be an optimal value for the obtention of very good performances of the diode.

On FIG. 3, the transitions between the ridged space and the waveguide are ensured by tapers 10 that are equivalent to transformers adapting the impedances. in order to compensate the reflections on the faces of the diode, its dimension indicated by $L_5$ along the longitudinal axis $\Delta$ of the waveguide, is a multiple of the half-length of the guided wave ($\lambda_g/2$) at the central frequency of the operating band. In a preferred manner, this dimension $L_5$ of the diode is equal to $\lambda_g$ for since it has been shown by experiments that for values of $L_5$ equal to $\lambda_g/2$ the insulation with or due to the diode was less and that for values $L_5$ equal to or higher than $3\lambda_g/2$ the insertion losses were higher.

Thus, for an operating frequency of 94 GHz, the guided wavelength in the silicon $\lambda_g$ is about 1.1 mm, and a value of about 2 half wavelengths for the dimension $L_5$ of the diode appears to be an optimal value for the obtention of very good overall performances.

The various values of the dimensions of the PIN diode given above thus allow to optimize the diode at the operating frequency involved, and in particular at 94 GHz. Indeed, for example at this frequency of 94 GHz, the capacity of the diode at zero polarization is given by:

$$C = \epsilon S/W$$

where $$\epsilon = \frac{12}{36\pi \cdot *10^9} \text{ in } MKSA,$$

W = the thickness of the zone I, otherwise of about 0.39 mm
S = the section of the zone I = $L_3 \times L_5$, otherwise or 0.2 mm $\times$ 1.1 mm, which gives a low value of capacity C of about $5 \cdot 8 \cdot 10^{-2}$ pF, or an impedance $1/C\omega$ of about 30 ohms. This high impedance value of the diode has the advantage of facilitating the impedance adaptation by connection elements called iris (not represented) disposed at the input and at the output of the waveguide.

Furthermore, since the electromagnetic waveguide is intended to transmit only one frequency the fact of having a width $L_3$ of diode of about 0.2 mm small by comparison with the wavelength in the silicon, of about 1.1 mm for a frequency of 94 GHz allows to prevent any disturbance by superior modes.

The results obtained by the structure of the PIN diode described above are particularly significant, especially at the frequency of 94 GHz: thus, for a pulsed incident power of 1 kW, the insertion losses measured at low level and at zero polarization are very small, being on the order of 1 dB, assembly included, of which only 0.4 dB is due to the diode. As to the insulation measured in direct polarization with a current value of 20 mA, this is high, in the range of 30 to 35 dB.

Furthermore, for an apparent resistivity in direct polarization of zone I of the silicon diode of about $3\Omega\cdot cm$, the skin thickness for this zone is about 300 microns, so that by admitting that the energy corresponding to 1 kW during a microsecond is totally dissipated in a slice of silicon having dimensions of 200 microns ($L_3$) $\times$ 400 microns ($L_4$) $\times$ 300 microns, the heating obtained from the diode is very low, of about 13° C., such a PIN diode can thus support impulse powers and durations clearly much higher.

Consequently, this PIN diode gives particularly good performances in millimetric waves and can be considered as optimal due to the combination of its particular dimensions that are, for an operating frequency of 94 GHz giving the results indicated below:
thickness e of each layer P+ and N+: 5 microns
thickness $L_4$: 0.4 mm
width $L_3$: 0.2 mm
dimension $L_5$ along the longitudinal axis of the guide: 1.1 mm It will be noted that the structure of the PIN diode has been described for a silicon diode. It is understood that the present invention can also apply to a PIN diode made of gallium arsenide with intrinsic material I doped at several $10^{13}$ atoms/cm$^3$.

What is claimed is:

1. A PIN diode for an electromagnetic wave switch which has a ridged metallic rectangular waveguide, having a longitudinal axis ($\Delta$), and having internal dimensions allowing the propagation of millimetric waves comprising:
a PIN diode mounted in the ridged space provided by said guide, said diode having zones P+ and N+, each of said zones having a thickness that is smaller than the respective skin thickness of the zones P+ and N+ at the operating frequency involved;
said PIN diode being in the form of a parallelepipedic bar having one rectangular straight section having a dimension aligned with respect to the longitudinal axis ($\Delta$) of the guide which is a multiple of the half-wavelength of a guided wave that occurs at said operating frequency;
wherein for said operating frequency being about 94 GHz, the resistivity of said zones P+ and N+ of said diode are each respectively about 0.007 $\Omega\cdot cm$, and the waveguide upon which the diode is placed is made of copper having a respective skin thickness for zones P+ and N+ of about 15 microns, the thickness of each zone P+ and N+ being between 2 to 5 microns.

2. A PIN diode according to claim 1, wherein for an operating frequency of about 94 GHz, the half wavelength of said guided wave being about 0.55 mm, the dimension of said PIN diode aligned with respect to the longitudinal axis ($\Delta$) is equal to twice the half-wavelength of the guided wave, i.e. about 1.1 mm.

3. A PIN diode according to claim 1, wherein said PIN diode is a parallelepipedic structure with the dimension of the PIN diode in a direction perpendicular to said longitudinal axis and perpendicular to said zone thicknesses being between 0.15 mm to 0.40 mm at the operating frequency involved.

4. A PIN diode according to claim 3, wherein the dimension of the PIN diode in a direction perpendicular to said longitudinal axis and perpendicular to said zone thicknesses is about 0.2 mm at the operating frequency of about 94 GHz.

5. A PIN diode according to claim 1, wherein the dimension of the PIN diode in the direction of said zone thicknesses is about 0.40 mm at the operating frequency of about 94 GHz.

6. A PIN diode according to claim 1, wherein the PIN diode is made of silicon.

7. A PIN diode according to claim 1, wherein the waveguide comprises a metallic step forming the ridged space on which is disposed the PIN diode, and wherein the guide is constituted from two parts one of which is a plane metallic plate and the other is a cross sectional U-shaped metallic plate comprising the step, the assembly of these two parts realizing the recess of the waveguide, and these two parts being insulated from each by a layer of insulating material.

8. A PIN diode according to claim 7, wherein said PIN diode has two opposed metallic faces which are respectively welded, one to the plane plate and the other to the step of the guide.

* * * * *